United States Patent [19]

Guild

[11] 4,141,733
[45] Feb. 27, 1979

[54] DEVELOPMENT OF LIGHT-SENSITIVE QUINONE DIAZIDE COMPOSITIONS

[75] Inventor: John R. Guild, Rochester, N.Y.

[73] Assignee: Eastman Kodak Company, Rochester, N.Y.

[21] Appl. No.: 844,951

[22] Filed: Oct. 25, 1977

[51] Int. Cl.² .................. G03C 1/58; G03C 5/22; G03C 5/34; G03C 1/52

[52] U.S. Cl. .................................. 96/49; 96/75; 96/86 P; 96/35; 96/35.1

[58] Field of Search ................ 96/49, 91 D, 114, 35.1, 96/36, 36.3, 36.2, 75, 86 P, 35

[56] References Cited

FOREIGN PATENT DOCUMENTS 51-562226 5/1976 Japan ............................................ 96/48
1328967 9/1973 United Kingdom ................. 260/501.17
1367830 9/1974 United Kingdom ........................ 96/49

*Primary Examiner*—Edward C. Kimlin
*Assistant Examiner*—Alfonso T. Suro Picó
*Attorney, Agent, or Firm*—A. P. Lorenzo

[57] ABSTRACT

Light-sensitive compositions containing a quinone diazide which are useful in positive-working photoresists and positive-working lithographic printing plates are developed with a developing composition comprising methyltriethanol ammonium hydroxide. The developing composition provides the advantage that it is free of metal ions and, accordingly, does not contaminate the surface of the image. It is additionally advantageous in that it provides extended development latitude, increased exposure latitude, improved resist contrast, improved prebake latitude, a low depletion rate and minimal loss of image layer thickness.

13 Claims, No Drawings

DEVELOPMENT OF LIGHT-SENSITIVE QUINONE DIAZIDE COMPOSITIONS

BACKGROUND OF THE INVENTION

1. Field of the Invention

This invention relates in general to the use of light-sensitive polymeric compositions in the graphic arts to produce photomechanical images and in particular to improvements in the image-forming development of positive-working photoresist films and positive-working lithographic printing plates containing light-sensitive quinone diazides. More specifically, this invention relates to the use of certain developing compositions which provide improved results in the development of the aforesaid photoresist films and printing plates.

2. Description of the Prior Art

An important class of light-sensitive materials that is widely utilized in the graphic arts in the formation of photomechanical images is the class of quinone diazides. These materials enjoy extensive use in such important applications as positive-working photoresist films and positive-working lithographic printing plates. Exposure of the composition to actinic radiation results in a solubility differential between the exposed and unexposed areas such that treatment with an appropriate developer results in removal of the radiation struck areas and retention of the desired image areas on the support. It is believed that such exposure decomposes the diazo structure in the radiation struck areas to form the free carboxylic acid group, thereby rendering the exposed areas soluble in alkaline developer solutions. The developer solutions which are employed for this purpose can be aqueous solutions or organic solutions. Typical examples of alkaline developer solutions utilized heretofore in development of quinone diazide compositions include solutions of sodium hydroxide, ammonium hydroxide, potassium hydroxide, sodium carbonate, sodium silicate or sodium phosphate. Developers containing lower alcohols, ketones, or amines such as the alkyl amines, cycloalkyl amines and alkanolamines, are also well known.

An important requirement in the commercial utilization of the aforesaid photomechenical imaging processes is the ability to form a fine, highly detailed image pattern. This is particularly critical in the utilization of photoresists in the semiconductor industry, for example, in the manufacture of integrated circuit devices. One of the problems restricting the capability of producing the desired fine image detail is contamination of the surface of the substrate by metal ions such as sodium or potassium ions, which are present in the developer solution. Contamination with such ions can deteriorate the substrate conductivity and adversely affect important properties of the integrated circuit device such as electrical resistivity. In an attempt to overcome this problem, efforts have been made heretofore toward providing a developer solution that is capable of providing the necessary high resolving power yet is free of metal ions. For example, Japanese Patent Publication No. 56226/1976 entitled "Developers For Positive-Type Photosensitive Resins," published May 17, 1976, points out the advantages of a developer which is free of metal ions. This publication proposes the use of tetraalkylammonium hydroxides, such as tetramethylammonium hydroxide or tetraethylammonium hydroxide, as developers. It points out that tetraalkanolammonium hydroxides, such as tetraethanolammonium hydroxide, can also be used as metal-ion-free developers but suffer from the disadvantages of strong odor and a high degree of toxicity. The use of tetramethylammonium hydroxide as a developer for positive-working photoresists is also disclosed in British Pat. No. 1,367,830.

SUMMARY OF THE INVENTION

It has now been discovered that improved development of light-sensitive quinone diazide compositions can be achieved by use of methyltriethanol ammonium hydroxide. This compound is a quaternary ammonium hydroxide in which the quaternary nitrogen atom is substituted by a methyl group and by three hydroxyethyl groups. It is not a tetraalkylammonium hydroxide since it comprises three hydroxyethyl groups. It is not a tetraalkanolammonium hydroxide since it includes a methyl group substituent. As compared with the tetraalkylammonium hydroxides it provides substantially improved performance in regard to such factors as development time latitude, development temperature latitude, exposure latitude, prebake latitude, resist contrast, depletion rate, and retention of image layer thickness. Moreover, it does not suffer from the disadvantages of strong odor and high toxicity which Japanese Patent Publication No. 56226/1976 attributes to tetraalkanolammonium hydroxides. Thus, the present invention provides an improved process for development of light-sensitive quinone diazide compositions using a metal-ion-free developing composition containing, as the developing agent, the compound methyltriethanol ammonium hydroxide which has the formula:

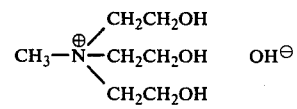

DESCRIPTION OF THE PREFERRED EMBODIMENTS

Light-sensitive quinone diazides are well known materials which have been extensively described in the patent literature, for example, in U.S. Pat. Nos. 2,754,209, 3,046,110, 3,046,112, 3,046,113, 3,046,116, 3,046,118, 3,046,119, 3,046,120, 3,647,443 and 3,759,711. The monomeric quinone diazide can be incorporated in an alkali-soluble resinous binder or reacted with an alkali-soluble resinous material so that it can be used satisfactorily as a resist material or can withstand the wear on printing plates.

The compositions and elements utilized in the practice of this invention preferably comprise a light-sensitive polymeric compound formed from the condensation reaction of a quinone diazide with a phenol-formaldehyde resin. Advantageously, the quinone diazide which is utilized has a linkage independently selected from the group consisting of sulfonyl

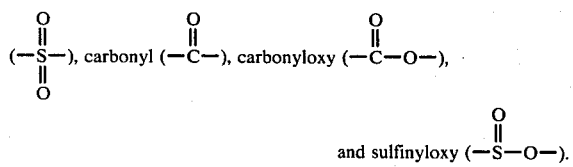

Most preferred is 1,2-naphthoquinone-2-diazide-5-sulfonyl chloride, having the formula

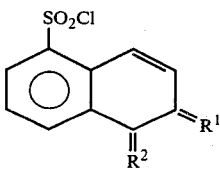

wherein $R^1$ and $R^2$ are interchangeably $N_2$ or O, and $R^1$ and $R^2$ are not the same.

Other quinone diazides useful in the practice of this invention are the acid esters and acid halides of o-benzoquinone diazide, 1,2-naphthoquinone-1-diazide, 7-methoxy-1,2-naphthoquinone-2-diazide, 6-chloro-1,2-naphthoquinone-2-diazide, 7-chloro-1,2-naphthoquinone-2-diazide, 6-nitro-1,2-naphthoquinone-2-diazide, 5-(carboxymethyl)-1,2-naphthoquinone-1-diazide, 3,3',4,4'-diphenyl bis-quinone-4,4'-diazide, 2,3-phenanthrenequinone-2-diazide, 9,10-phenanthrenequinone-10-diazide, 3,4-chrysenequinone-3-diazide, and the like, including quinone diazides substituted with such groups as alkyl generally having one to eight carbon atoms, e.g., methyl, ethyl, propyl, butyl, amyl, hexyl, heptyl, octyl, etc.; alkoxy generally having 1 to 8 carbon atoms, e.g., methoxy, ethoxy, propoxy, butoxy, amyloxy, hexyloxy, heptyloxy, octyloxy, etc.; and like substituents which do not interfere with the photosensitive properties of the quinone diazide.

The phenol-formaldehyde resins used in the practice of this invention, such as novolac or resole resins, are described in Chapter XV of "Synthetic Resins in Coatings," H. P. Preuss, Noyes Development Corporation (1965), Pearl River, N.Y.

The novolac resins are prepared by the condensation of phenols and aldehydes under acidic conditions whereas the resole resins are prepared under basic conditions. Less than 6 moles of formaldehyde are used per 7 moles of phenol to provide products which are permanently fusible and soluble. In a typical synthesis, novolacs are prepared by heating 1 mole of phenol with 0.5 mole of formaldehyde under acidic conditions. The temperatures at which the reaction is conducted are generally from about 25° C. to about 175° C.

These resins are prepared by the condensation of phenol with formaldehyde, more generally by the reaction of a phenolic compound having two or three reactive aromatic ring hydrogen positions with an aldehyde or aldehyde-liberating compound capable of undergoing phenolaldehyde condensation. Illustrative of particularly useful phenolic compounds are cresol, xylenol, ethylphenol, butylphenol, isopropylmethoxy-phenol, chlorophenol, resorcinol, hydroquinone, naphthol, 2,2-bis(p-hydroxyphenyl)propane and the like. Illustrative of especially efficacious aldehydes are formaldehyde, acetaldehyde, acrolein, crotonaldehyde, furfural, and the like. Illustrative of aldehyde-liberating compounds are 1,3,5-trioxane, etc. Ketones such as acetone are also capable of condensing with the phenolic compounds.

The most suitable phenolic resins are those which are insoluble in water and trichloroethylene but readily soluble in conventional organic solvents such as methyl ethyl ketone, acetone, methanol, ethanol, etc. Phenolic resins having a particularly desirable combination of properties are those which have an average molecular weight in the range between about 350 and 40,000, and preferably in the range between about 350 and 2000.

Preferred phenolic resins are cresol-formaldehyde and phenol-formaldehyde.

The light-sensitive polymeric compounds which are particularly useful in the present invention are prepared from condensation reactions of a suitable quinone diazide (e.g. one of those listed above) with a suitable phenol-formaldehyde resin. These reactions are usually carried out in an organic medium, such as dioxane, tetrahydrofuran, acetone, etc., where the concentration of the reactive compounds is in the range of 1 to 50 percent of the solution weight; at a temperature in the range of 0° C. to 78° C. and at various pressures, preferably atmospheric pressure. The molar ratio of quinone diazide to phenol-formaldehyde resin is in the range of about 99:1 to about 1:99 and preferably from 1:25 to 1:5. The resulting quinone diazide phenol-formaldehyde polymer can be collected by precipitation of the reaction product into a dilute acid, such as hydrochloric acid and filtering.

The light-sensitive quinone diazide compositions disclosed herein can further comprise a non-light-sensitive film-forming polymer wherein the weight ratio of light-sensitive polymer to non-light sensitive polymer is in the range of about 1:1 to about 99:1. As the amount of quinone diazide used in a photosensitive composition is increased the described amount of non-light-sensitive polymer increases.

The non-light-sensitive polymers are typically addition homopolymers or interpolymers formed by the addition polymerization of one or more unsaturated compounds containing the unit

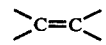

and generally having a molecular weight in the range of about 2000 to about 50,000, although they can have higher or lower molecular weights for particular applications.

Unsaturated compounds which can be homopolymerized or interpolymerized and used as non-light-sensitive polymeric binders include vinyl amines, vinyl imines, substituted and unsubstituted styrenes, acrylates and methacrylates such as alkyl acrylates and alkyl methacrylates, vinyl halides, vinyl esters, vinyl ethers, vinyl ketones, divinyl ethers, acrylonitrile, mixed ester-amides and maleic anhydride, 1,3-butadiene, isoprene, chloroprene, divinylbenzene, acrylic and methacrylic acid derivatives such as nitriles and amides, and others known to those having ordinary skill in the art.

Interpolymers and homopolymers can be prepared by any suitable method including addition polymerization, for example, bulk, solution, bead and emulsion polymerization methods in the presence of a polymerization initiator. For example, polymerization of aminostyrene is conveniently carried out by contacting a mixture of aminostyrene and another polymerizable ethylenically unsaturated compound with from 0.1% to 10%, preferably 0.2 to 2%, of a free radical liberating polymerization initiator.

Examples of suitable initiators are peroxy compounds, for example, benzoyl peroxide or di(tertiary amyl)peroxide and azo initiators, for example, 1,1'-azodicyclohexanecarbonitrile or azodiisobutyronitrile. The polymerization can be carried out in the presence or absence of an inert solvent such as a hydrocarbon, for example, benzene, white mineral oil, or lubricating oil, acetic acid, dioxane, etc., and preferably in an inert atmosphere, for example, under a blanket of nitrogen. The mixture is maintained at a temperature at which the polymerization initiator generates free radicals rapidly. The exact temperature selected depends on the particular initiator being used. Temperatures ranging from room temperature or lower up to 150° C. or higher are suitable. It is usually desirable to carry the polymerization substantially to completeness so that no unpolymerized monomer remains and the proportions of each component in the final product are essentially those of the original monomer mixture.

Other non-light-sensitive polymers suitable for use in the present invention are film-forming condensation resins, such as phenol-formaldehyde resins and others known to those having ordinary skill in the art.

Photosensitive compositions can be prepared by forming a solution of the light-sensitive polymeric compound alone or mixed with a film forming non-light-sensitive material. These compositions can then be used to form resists or lithographic plates.

The solvents which can be employed as coating solvents in preparing coating compositions with the light-sensitive materials described herein are preferably organic solvents which may be selected from those which are capable of dissolving at least 0.2% by weight of the light-sensitive materials employed but are unreactive toward the light-sensitive materials and which are substantially incapable of attacking the substrates employed. Exemplary solvents include dimethylformamide, cyclohexane, cyclohexanone, acetonitrile, 2-ethoxyethanol, acetone, 4-butyrolacton, ethylene glycol monomethyl ether acetate, 2-methoxyethyl acetate, butyl acetate, and mixtures of these solvents with each other or with one or more of the lower alcohols and ketones.

The concentrations of light-sensitive polymer in the coating solutions are dependent upon the nature of the light-sensitive materials, the supports and the coating methods employed. Particularly useful coatings are obtained when the coating solutions contain from about 0.05 to about 25 percent by weight of light-sensitive material.

It will be recognized that additional components can be included in the coating compositions described herein. For example, dyes and/or pigments can be included to obtain colored images; resins, stabilizers and surface active agents can be utilized to improve film formation, coating properties, adhesion of the coatings to the supports employed, mechanical strength, chemical resistance, etc.

Photosensitive elements bearing layers of the polymeric materials disclosed herein can be prepared by coating the photosensitive compositions from solvents onto supports in accordance with usual practices. Suitable support materials include fiber base materials such as paper, polyethylene-coated paper, polypropylene-coated paper, parchment, cloth, etc.; sheets and foils of such metals as aluminum, copper, magnesium, zinc, etc.; glass and glass coated with such metals as chromium, chromium alloys, steel, silver, gold, platinum, etc.; synthetic polymeric materials such as poly(alkyl methacrylates), e.g., poly(methyl methacrylate), polyester film base, e.g., poly(ethylene terephthalate), poly(vinyl acetals), polyamides, e.g., nylon, cellulose ester film base, e.g., cellulose nitrate, cellulose acetate, cellulose acetate propionate, cellulose acetate butyrate, and the like. For the manufacture of integrated circuit devices, silcon wafers are typically utilized as the support material. The supports, and especially polymeric supports such as poly(ethylene terephthalate), can be subcoated with materials which aid adhesion to the support. A preferred class of subcoatings are polymers, copolymers and terpolymers of vinylidene chloride alone or with acrylic monomers such as acrylonitrile, methyl acrylate, etc., and unsaturated dicarboxylic acids such as itaconic acid, etc. The support can also carry a filter or antihalation layer composed of a dyed polymer layer which absorbs the exposing radiation after it passes through the light-sensitive layer and eliminates unwanted reflection from the support. A yellow dye in a polymeric binder, such as one of the polymers referred to above as suitable subcoatings, is an especially effective antihalation layer when ultraviolet radiation is employed as the exposing radiation. The optimum coating thickness of the light-sensitive layer will depend upon such factors as the use to which the coating will be put, the particular light-sensitive polymer employed, and the nature of other components which may be present in the coating.

The photographic elements employed in the present invention can be imagewise exposed by conventional methods to a source of actinic radiation which is preferably a source which is rich in ultraviolet light. Suitable sources include carbon arc lamps, mercury vapor lamps, fluorescent lamps, tungsten filament lamps, lasers, and the like. The exposed elements can then be developed by flushing, soaking, swabbing, or otherwise treating the light-sensitive layers with the developing composition of this invention. The exposed areas of the coating will be removed by the developing composition while the unexposed areas will be unaffected. The development time can vary widely depending on such factors as the strength of the developing composition and the particular light-sensitive composition utilized and can range from a few seconds to several minutes, most typically from about 30 seconds to about 120 seconds.

A preferred procedure for forming the element comprises cleaning the surface which is to be etched, applying the photoresist solution by a suitable technique such as spraying, dipping or whirl coating, and then drying the coating. If desired, a prebake of 10 to 30 minutes at 80° C. to 100° C. is given to remove residual solvent and the coating is exposed through a pattern to a light source. The resist coating is then placed in the developing composition to remove the exposed areas. The developing composition can also contain dyes and/or pigments and hardening agents. The developed image is rinsed with distilled water, dried and optionally post-baked for 15 to 30 minutes at 80° C. to 120° C. The substrate can then be etched by acid etching solutions such as ferric chloride.

As described hereinabove, the developing compositions utilized in the practice of this invention are aqueous solutions of methyltriethanol ammonium hydroxide. The concentration of methyltriethanol ammonium hydroxide in the solution can vary widely, with optimum concentrations being dependent upon such features as the particular light-sensitive material to which the developing composition is applied and the desired development time. Typically, the concentration of methyltriethanol ammonium hydroxide in the aqueous solution will be in the range from about 1 to about 30 percent by weight, more usually in the range from about 3 to about 24 percent by weight. To obtain the most advantageous results in the method of this invention the developing composition is preferably free, or at least substantially free, of metal ions such as sodium or potassium ions.

Methyltriethanol ammonium hydroxide and methods for its preparation are described in British Pat. No. 1,328,967 published Sept. 5, 1973.

The invention is further illustrated by the following examples of its practice. These examples illustrate the advantageous results obtained in using methyltriethanol ammonium hydroxide as a developer for light-sensitive quinone diazide compositions. For purposes of comparison, the examples include tests made with methyltriethanol ammonium hydroxide (MTEAH) and with other quaternary ammonium hydroxides of similar structure, namely tetramethyl ammonium hydroxide (TMAH) which has the formula:

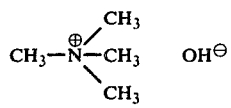

tetraethyl ammonium hydroxide (TEAH) which has the formula:

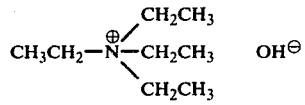

benzylmethyldiethanol ammonium hydroxide (BMDEAH) which has the formula:

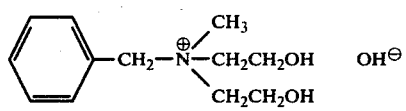

and benzyldimethylethanol ammonium hydroxide (BDMEAH) which has the formula:

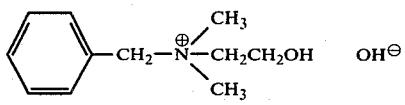

Tests reported in the examples were carried out with five commercially available positive-working photoresists all of which are quinone diazide materials. The materials employed were resists sold by Eastman Kodak Company under the name KMPR-809, by Philip A. Hunt Chemical Corporation under the name HPR-104, by Shipley Company, Inc. under the names AZ1350J and AZ111 and by Tokyo Ohka Hyogo Company under the name OFPR. All of these resists are comprised of a non-light-sensitive polymeric binder and, as the sensitizer, a light-sensitive polymeric compound formed from the condensation reaction of a quinone diazide with a phenolic resin.

EXAMPLE 1

Photoresist KMPR-809 was spin coated on silicon wafers to give a dry resist film of 10,000A. The coated wafers were prebaked for 30 minutes at 90° C., exposed 10 seconds to a medium pressure mercury lamp (200 watts) and immersion developed with slight agitation for 30 seconds, 60 seconds, and 120 seconds. The following quaternary ammonium hydroxide compounds were utilized as developers.

(1) Tetramethylammonium hydroxide (TMAH)
(2) Tetraethylammonium hydroxide (TEAH)
(3) Methyltriethanol ammonium hydroxide (MTEAH)
(4) Benzylmethyldiethanol ammonium hydroxide (BMDEAH)
(5) Benzyldimethylethanol ammonium hydroxide (BDMEAH)

Table I summarizes the coating thickness loss of KMPR-809 films (non-exposed areas) as a function of development time versus concentration.

Table I

| Developing Agent | Concentration (%) (in Distilled H₂O) | Coating Thickness Loss During Development (%) | | |
|---|---|---|---|---|
| | | (30 Sec. Development) | (60 Sec. Development) | (120 Sec. Development) |
| TMAH | 5 | 100 | 100 | 100 |
| TMAH | 4 | 100 | 100 | 100 |
| TMAH | 3 | 100 | 100 | 100 |
| TMAH | 2 | 48 | 91 | 100 |
| TMAH | 1 | Incomplete Development | Incomplete Development | 1.0 |
| TEAH | 5 | 68 | 100 | 100 |
| TEAH | 4 | 22 | 49 | 91 |
| TEAH | 3 | Incomplete Development | 3.0 | 8.0 |
| TEAH | 2 | No Development | No Development | No Development |
| TEAH | 1 | No Development | No Development | No Development |
| MTEAH | 10 | 56 | 100 | 100 |
| MTEAH | 9 | 44 | 91 | 100 |
| MTEAH | 8 | 31 | 61 | 100 |
| MTEAH | 7 | 20 | 42 | 91 |
| MTEAH | 6 | 10 | 26 | 56 |
| MTEAH | 5 | 6 | 11 | 23 |
| MTEAH | 4 | 2 | 4 | 4.0 |
| MTEAH | 3 | Incomplete Development | 00 | 1.0 |
| MTEAH | 2 | Incomplete Development | Incomplete Development | Incomplete Development |
| MTEAH | 1 | No Development | No Development | No Development |
| BDMEAH | 10 | 100 | 100 | 100 |
| BDMEAH | 8 | 100 | 100 | 100 |
| BDMEAH | 6 | 100 | 100 | 100 |
| BDMEAH | 4 | Incomplete Development | Incomplete Development | Incomplete Development |
| BDMEAH | 2 | Incomplete Development | Incomplete Development | Incomplete Development |
| BDMEAH | 10 | 100 | 100 | 100 |
| BDMEAH | 8 | 100 | 100 | 100 |
| BDMEAH | 6 | 100 | 100 | 100 |
| BDMEAH | 4 | Incomplete Development | Incomplete Development | Incomplete Development |

Table I-continued

Coating Thickness Loss vs. Developer Concentration for Various Quaternary Ammonium Hydroxides

| Developing Agent | Concentration (%) (in Distilled H$_2$O) | Coating Thickness Loss During Development (%) | | |
|---|---|---|---|---|
| | | (30 Sec. Development) | (60 Sec. Development) | (120 Sec. Development) |
| BDMEAH | 2 | Incomplete Development | Incomplete Development | Incomplete Development |

Generally a maximum coating thickness loss (non-exposed areas) of 10% is considered the upper limit when using a good positive resist developer. Results Table II summarizes the loss in coating thickness (non-exposed areas) for each resist as a function of development time versus MTEAH concentration.

Table II

Coating Thickness Loss vs. Developer Concentration for Commercially Available Positive Resists

| Developing Agent | Concentration (%) (in Distilled H$_2$O) | Resist (Positive) | Coating Thickness Loss During Development (%) | | |
|---|---|---|---|---|---|
| | | | (30 Sec. Development) | 60 Sec. Development) | (120 Sec. Development) |
| MTEAH | 47 | HPR-104 | 100 | 100 | 100 |
| MTEAH | 23.5 | HPR-104 | 9.2 | 67.3 | 100 |
| MTEAH | 11.75 | HPR-104 | 2.0 | 4.1 | 16.3 |
| MTEAH | 6.7 | HPR-104 | No Development | Incomplete Development | No Development |
| MTEAH | 3.4 | HPR-104 | No Development | No Development | No Development |
| MTEAH | 47 | OFPR | 40 | 100 | 100 |
| MTEAH | 23.5 | OFPR | 19.6 | 44.9 | 100 |
| MTEAH | 11.75 | OFPR | Incomplete Development | 9.8 | 23.5 |
| MTEAH | 6.7 | OFPR | No Development | No Development | 5.9 |
| MTEAH | 3.4 | OFPR | No Development | No Development | No Development |
| MTEAH | 47 | AZ-1350J | 100 | 100 | 100 |
| MTEAH | 23.5 | AZ-1350J | 26.5 | 49 | 100 |
| MTEAH | 11.75 | AZ-1350J | 00 | 6.1 | 18.4 |
| MTEAH | 6.7 | AZ-1350J | No Development | Incomplete Development | 2.0 |
| MTEAH | 3.4 | AZ-1350J | No Development | No Development | No Development |
| MTEAH | 47 | AZ-111 | No Development | No Development | No Development |
| MTEAH | 23.5 | AZ-111 | No Development | No Development | No Development |
| MTEAH | 11.75 | AZ-111 | No Development | No Development | No Development |
| MTEAH | 6.7 | AZ-111 | No Development | No Development | No Development |
| MTEAH | 3.4 | AZ-111 | No Development | No Development | No Development |
| MTEAH | 47 | KMPR-809 | 100 | 100 | 100 |
| MTEAH | 23.5 | KMPR-809 | 100 | 100 | 100 |
| MTEAH | 11.75 | KMPR-809 | 100 | 100 | 100 |
| MTEAH | 6.7 | KMPR-809 | 19 | 56 | <100 |
| MTEAH | 3.4 | KMPR-809 | 0.0 | 2.0 | 7.0 | from Table I clearly show that only methyltriethanol ammonium hydroxide has acceptable development latitude over a wide range of concentrations. These results can be summarized as follows:

| Acceptable Quaternary Ammonium Hydroxide Levels Within the 30-120 Sec. Development Frame | |
|---|---|
| Quaternary Ammonium Hydroxide | Concentration |
| TMAH | 1% |
| TEAH | 3% |
| MTEAH | 3-6% |
| BDMEAH | No Acceptable |
| BMDEAH | No Acceptable |

Test results have also shown a much slower depletion rate with MTEAH than with the other quaternary ammonium hydroxide compounds. This slow depletion rate can be directly attributed to the wider development latitude obtained with MTEAH.

EXAMPLE 2

Methyltriethanol ammonium hydroxide was tested for its utility as a developer with the five commercially available positive photoresists described above, namely KMPR-809, HPR-104, AZ1350J, AZ111 and OFPR.

Each resist was spin coated on silicon wafers to give a dry resist film of 10,000A. Prebake and exposure times were followed according to the manufacturer's recommendations. Samples were immersion developed in a series of methyltriethanol ammonium hydroxide concentrations for 30 seconds, 60 seconds, and 120 seconds.

Results reported in Table II indicate a specific concentration of methyltriethanol ammonium hydroxide for each resist except AZ-111 which will function as an acceptable developer. These results can be summarized as follows:

| Acceptable Methyltriethanol Ammonium Hydroxide Levels Within the 30 - 120 sec. Development Frame | | |
|---|---|---|
| Positive Resist | Methyltriethanol Ammonium Hydroxide | |
| HPR-104 | 11.75 - 23.5% | Concentration |
| OFPR | 6.7 - 11.75% | Concentration |
| AZ 1350J | 6.7 - 11.75% | Concentration |
| KMPR-809 | 3 - 6% | Concentration |
| AZ-111 | No Acceptable | Concentration |

As indicated by the results reported in Examples 1 and 2, of the quaternary ammonium hydroxides tested only methyltriethanol ammonium hydroxide provided good development latitude. This is a highly surprising result considering the similarity in structure between methyltriethanol ammonium hydroxide and the other quaternary ammonium hydroxides tested. In addition, methyltriethanol ammonium hydroxide provides increased exposure latitude because of better differentiation by the developer between exposed and non-exposed areas. By use of methyltriethanol ammonium hydroxide the problems encountered with prior art developers are overcome and a metal-ion-free developer is provided which is capable of providing a high degree of resolution, has excellent development latitude, and does not suffer from such disadvantages as strong odor and high toxicity.

In using aqueous solutions of methyltriethanol ammonium hydroxide as a developer for light-sensitive quinone diazide compositions, in acccordane with this invention, it has been observed that substantially improved effectiveness as a developer is achieved when a concentrated aqueous solution of methyltriethanol ammonium hydroxide, for example, a solution containing at least about 40 percent by weight of methyltriethanol ammonium hydroxide is allowed to be stored at room temperature for prolonged periods of time, for example, periods of at least about 60 days. This improved effectiveness is evidenced by greater development latitude, that is, by the fact that a broader range of development times and development concentrations will give acceptable results. While the reason for this is not known with certainty, it is believed that some degree of decomposition of methyltriethanol ammonium hydroxide gradually takes place in such concentrated aqueous solutions and that such decomposition may result in the formation of an amine which acts in a synergistic manner to improve the effectiveness of methyltriethanol ammonium hydroxide as a developing agent for quinone diazides. Such improved effectiveness may result at least in part from reduced capability to wet and penetrate the non-exposed areas of the quinone diazide layer.

The invention has been described in detail with particular reference to preferred embodiments thereof, but it will be understood that variations and modifications can be effected within the spirit and scope of the invention.

I claim:

1. In a process for forming a resist image which comprises imagewise exposing to actinic radiation a layer of a light-sensitive quinone diazide composition and developing the exposed layer with an alkaline developing composition, the improvement wherein said alkaline developing composition comprises methyltriethanol ammonium hydroxide.

2. The process as claimed in claim 1 wherein said developing composition is an aqueous solution containing about 1 to about 30 percent by weight of methyltriethanol ammonium hydroxide.

3. The process as claimed in claim 1 wherein said developing composition is an aqueous solution containing about 3 to about 24 percent by weight of methyltriethanol ammonium hydroxide.

4. The process as claimed in claim 1 wherein said developing composition is an aqueous solution containing about 3 to about 6 percent by weight of methyltriethanol ammonium hydroxide.

5. The process as claimed in claim 1 wherein said quinone diazide composition is comprised of a monomeric quinone diazide incorporated in an alkali-soluble resinous binder.

6. The process as claimed in claim 1 wherein said quinone diazide composition is comprised of a monomeric quinone diazide that has been reacted with an alkali-soluble resinous material.

7. The process as claimed in claim 1 wherein said quinone diazide composition comprises a polymeric compound formed from the condensation reaction of a quinone diazide with a phenol-formaldehyde resin.

8. The process as claimed in claim 1 wherein said quinone diazide composition comprises a polymeric compound formed from the condensation reaction of a naphthoquinone diazide with a phenol-formaldehyde resin.

9. The process as claimed in claim 1 wherein said quinone diazide has a linkage selected from the group consisting of sulfonyl, carbonyl, carbonyloxy and sulfinyloxy.

10. The process as claimed in claim 1 wherein said quinone diazide composition comprises a polymeric compound formed from the condensation reaction of 1,2-naphthoquinone-2-diazide-5-sulfonyl chloride with a phenol-formaldehyde resin.

11. The process as claimed in claim 1 wherein said quinone diazide composition comprises a non-light-sensitive film-forming polymeric binder and a polymeric compound formed from the condensation reaction of a quinone diazide with a phenol-formaldehyde resin.

12. The process as claimed in claim 1 wherein said layer of light-sensitive quinone diazide composition is a coating on a silicon wafer.

13. In a process for forming a resist image which comprises imagewise exposing to actinic radiation a layer of a light-sensitive quinone diazide composition and developing the exposed layer with an alkaline developing composition, the improvement wherein said alkaline developing composition is an aqueous composition which is substantially free of metal ions and contains a sufficient concentration of methyltriethanol ammonium hydroxide to remove the exposed areas of said layer of light-sensitive quinone diazide composition without substantial removal of the unexposed areas.

* * * * *